(12) United States Patent
McLeod

(10) Patent No.: US 6,497,799 B1
(45) Date of Patent: Dec. 24, 2002

(54) METHOD AND APPARATUS FOR SPUTTER DEPOSITION OF MULTILAYER FILMS

(75) Inventor: Paul S. McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/832,115

(22) Filed: Apr. 11, 2001

Related U.S. Application Data
(60) Provisional application No. 60/197,222, filed on Apr. 14, 2000.

(51) Int. Cl.[7] ................................................. C23C 14/34
(52) U.S. Cl. ............................ 204/192.2; 204/192.12; 204/298.12; 204/298.26; 204/298.28
(58) Field of Search ..................... 204/192.12, 192.2, 204/298.12, 298.13, 298.15, 298.26, 298.28

(56) References Cited

U.S. PATENT DOCUMENTS

| | | | | |
|---|---|---|---|---|
| 4,558,388 A | | 12/1985 | Graves, Jr. ................. 360/135 |
| 4,761,218 A | | 8/1988 | Boys ........................... 204/298 |
| 4,793,911 A | | 12/1988 | Kemmerer et al. ......... 204/298 |
| 4,894,133 A | * | 1/1990 | Hedgcoth .............. 204/192.15 |
| 5,240,583 A | * | 8/1993 | Ahonen .................. 204/298.04 |
| 5,441,804 A | * | 8/1995 | Akitake et al. ............. 428/336 |
| 5,985,356 A | * | 11/1999 | Schultz et al. ................. 427/8 |

* cited by examiner

Primary Examiner—Steven H. VerSteeg
(74) Attorney, Agent, or Firm—McDermott, Will & Emery

(57) ABSTRACT

Apparatus for forming a multilayer film on at least one surface of a substrate comprises a vacuum chamber including:

(a) a pair of parallel top and bottom walls connected by a side wall;

(b) at least one entry/exit means in the side wall for insertion and withdrawal of a substrate from the chamber;

(c) a plurality of spaced-apart, radially extending, linearly elongated sputtering sources arranged in a co-planar array adjacent one of the top or bottom walls of the chamber, each of the linearly elongated sputtering sources having a length and a width; and (d) a gripper/transporter for gripping and moving a substrate in a generally circular, planar path past each of the plurality of radially extending sputtering sources, such that the at least one deposition surface of the substrate faces each of the sputtering sources during movement along the circular path, for deposition of the multilayer film thereon.

20 Claims, 3 Drawing Sheets

METHOD AND APPARATUS FOR SPUTTER DEPOSITION OF MULTILAYER FILMS

CROSS-REFERENCE TO PROVISIONAL APPLICATION

This application claims priority from U.S. provisional patent application Serial No. 60/197,222, filed Apr. 14, 2000, the entire disclosure of which is incorporated herein by reference.

FIELD OF THE INVENTION

The present invention relates to a method and apparatus for performing multilayer film deposition on a substrate surface, e.g., a disk-shaped substrate, which method and apparatus utilizes a side-loading, multiple linear magnetron cathode sputtering device. The invention has particular utility in the formation of multilayer superlattice structures, e.g., $(Co/Pt)_n$ and $(Co/Pd)_n$ superlattices, as part of automated manufacture of magnetic and magneto-optical (MO) data/information recording, storage, and retrieval media in disk form.

BACKGROUND OF THE INVENTION

Magnetic and magneto-optical media are widely employed in various applications, particularly in the computer industry for data/information storage and retrieval purposes. A conventional, single-sided, longitudinal magnetic recording medium 1 in e.g., disk form, such as utilized in computer related applications, is schematically depicted in FIG. 1 and comprises a non-magnetic substrate 10, e.g., of glass, ceramic, glass-ceramic composite, polymer, metal, or metal alloy, typically an aluminum (Al)-based alloy such as aluminum-magnesium, having at least one major surface on which a layer stack comprising a plurality of thin film layers constituting the medium are sequentially deposited. Such layers typically include a plating layer 11, as of amorphous nickel-phosphorus (NiP), a polycrystalline underlayer 12, typically of chromium (Cr) or a Cr-based alloy, a magnetic recording layer 13, e.g., of a cobalt (Co)-based alloy, a protective overcoat layer 14, typically containing carbon (C), e.g., diamond-like carbon (DLC), and a lubricant topcoat layer 15, typically of a perfluoropolyether compound.

Magneto-optical (MO) recording media (MO) similarly comprise a laminate of layers formed over a suitable substrate, e.g., a disk. By way of illustration, shown in FIG. 2 is a single-sided MO medium 20 having a first surface magneto-optical (FSMO) layer configuration, wherein reference numeral 21 denotes a disk-shaped substrate formed of a material selected from, for example, aluminum (Al), plated aluminum, aluminum alloys, metals, metal alloys, glass, ceramics, and glass-ceramic composite materials. Formed on one surface 21A of substrate 21 is a layer stack, comprising, in sequence from surface 21A, a reflective, heat sinking layer 22, comprising Al or an alloy thereof, e.g., AlCr, AlTi, AlCu, AlMo, etc., which layer may also serve to prevent laser beam transmission through the substrate when the latter is transparent, as in the case of glass or glass-based materials, and thus render surface 21A opaque; a first dielectric material layer 23, substantially transparent to the wavelength(s) of the at least one laser beam employed for writing and reading out information stored in the medium, typically selected from $SiN_x$, $AlN_x$, $SiO_x$, and $AlO_x$; a MO read-write layer 24, for example, comprising a rare earth-transition metal thermo-magnetic (RE-TM) material having perpendicular magnetic anisotropy, large perpendicular coercivity $H_c$ at room temperature, and high Curie temperature $T_c$, typically selected from TbFe, TbFeCo, TbDyFeCo, etc.; a second transparent dielectric material 25 typically selected from the same materials utilized for the first transparent dielectric layer 23; a thin, amorphous, diamond-like carbon (DLC) protective overcoat layer 26; and a lubricant topcoat layer 27, typically comprising a fluoropolyether or perfluoropolyether material.

A promising new class of materials suitable for use as the magnetic recording layer 13 of the magnetic medium of FIG. 1 or the MO read-write layer 24 of the magneto-optical (MO) medium of FIG. 2 includes cobalt/platinum $(Co/Pt)_n$ and cobalt-palladium $(Co/Pd)_n$ multilayer stacks, also referred to as "superlattice" structures. As schematically illustrated in FIG. 3, such multilayer stacks or superlattice structures 30 comprise n pairs of alternating discrete layers of Co (designated by letter A in the drawing) and Pt or Pd (designated by letter B in the drawing), where n=an integer between about 10 and about 30. Superlattice 30 is typically formed by a suitable vapor deposition technique and can exhibit perpendicular magnetic anisotropy arising from metastable chemical modulation in the direction normal to the substrate. Compared to conventional cobalt-chromium (Co—Cr) alloys utilized in magnetic data storage/retrieval disk applications, such $(Co/Pt)_n$ and $(Co/Pd)_n$ multilayer or superlattice structures offer an economic advantage in facilitating room temperature deposition processing necessary for utilization of lower cost polymeric substrates. When utilized in MO disk-based applications, $(Co/Pt)_n$ and $(Co/Pd)_n$ superlattices offer superior corrosion resistance and blue wavelength response vis-a-vis conventional RE-TM alloys.

For example, a $(Co/Pt)_n$ multilayer stack or superlattice 30 suitable for use as the magnetic recording layer 13 of the magnetic recording medium of FIG. 1 or the magneto-optical (MO) read-write layer 24 of the MO medium of FIG. 2 can comprise a plurality of Co/Pt pairs, i.e., n=about 10 to about 30, e.g., 13, wherein each Co/Pt pair consists of a 3–5 Å thick Co layer adjacent to an 8 Å thick Pt layer, for a total of 26 separate or discrete layers. When utilized as a high recording density magneto-optical (HDMO) read-write layer 24 in e.g., a MO medium as illustrated in FIG. 2, such multilayer stacks or superlattice structures 30 are characterized by having a large perpendicular anisotropy and high coercivity, high squareness ratio (S) for a magnetic hysteresis (M-H) loop measured in the perpendicular direction, and high Kerr rotation angle for light of a particular wavelength region, e.g., blue or red light. By way of illustration, but not limitation, $(Co/Pt)_n$ and $(Co/Pd)_n$ HDMO superlattices, wherein n=about 10 to about 30 pairs of Co and Pt or Pd layers having thicknesses as indicated supra and fabricated, e.g., by means of techniques disclosed in U.S. Pat. No. 5,750,270, the entire disclosure of which is incorporated herein by reference, exhibit perpendicular anisotropy exceeding about $2 \times 10^6$ erg/cm$^3$; coercivity as high as about 5,000 Oe; squareness ratio (S) of a M-H loop, measured in the perpendicular direction, of from about 0.85 to about 1.0; and carrier-to-noise ratio (CNR) of from about 30 dB to about 60 dB.

According to conventional methodologies and practices for automated manufacture of disk-shaped magnetic and MO media, when the various above-described thin film layers constituting the medium are deposited on the disk-shaped substrates, as by cathode sputtering techniques, it is generally advantageous to coat one disk at a time with the various requisite layers. However, the continuing requirement for increased storage density has increased the number of requisite layers and, as the number of requisite layers increases, it becomes impractical to build and operate linearly arranged, multi-chamber cathode sputtering apparatus wherein each separate or discrete layer to be deposited requires a separate vacuum chamber, because the resulting system becomes unwieldy as a result of its great length.

The above-described difficulty associated with increasing numbers of requisite layers is magnified in the case of recording media comprising $(Co/Pt)_n$ or $(Co/Pd)_n$ multilayer stacks or superlattice structures where n=about 10 to about 30 layer pairs, due to the very large number of individual layers required to be deposited. Currently available disk processing apparatus, whether pallet pass-by, single disk, or some variation thereof, do not have an adequate cathode count for single-pass coating of a large number of layers. Certain types of existing sputtering apparatus can be modified to perform multiple pass, back-and-forth, or up-and-down repetitive disk transport to fabricate multilayer stacks with a limited number of sputtering cathodes, but such reduction in cathode number incurs a significant reduction in productivity, hence increased manufacturing cost.

Moreover, to date, no production-type sputtering system based upon such modification of existing sputtering apparatus, is capable of performing multilayer deposition on 95 mm diameter disks with a required radial film uniformity (e.g., +/−3% thickness variation).

Other types of existing sputtering apparatus, e.g., the Intevac MDP 250 style frequently utilized for magnetic and MO recording disk manufacture, transport each disk with an intermittent up-and-down motion which can be exploited for reducing the requisite number of coating stations; however, the required number of sputtering cathode/target assemblies cannot be reduced.

It is therefore considered that a method and apparatus for forming multilayer stacks or superlattice structures which minimizes the requisite number of sputtering cathode/target assemblies without sacrificing productivity is required for realizing economically viable manufacture of $(Co/Pt)_n$ and $(Co/Pd)_n$ superlattice-based magnetic and/or MO recording media. One possible approach for achieving such result is to utilize nested, annularly-shaped, independently powered Co and Pt or Pd sputtering cathodes/targets which can be alternately energized to sputter discrete layers of Co and Pt or Pd to form a multilayer stack. However, this approach entails several drawbacks, e.g., fabrication of the annularly-shaped targets is expensive, the cathode/target structure is mechanically complex, and control of the film thickness and properties in the radial direction is limited, resulting in excessive radial non-uniformity, as for example, shown in FIG. 4.

Accordingly, there exists a need for improved means and methodology for forming, as by cathode sputtering, multilayer stacks or superlattice structures, for use in e.g., single- and dual-sided magnetic and/or MO data/information storage and retrieval media in disk form, which means and methodology form part of a multi-station processing apparatus and enable rapid, simple, and cost-effective formation of such media.

The present invention, wherein multilayer or superlattice structures are formed in a side-loading sputtering chamber utilized as part of a multi-chamber system, the side-loading sputtering chamber containing a plurality of co-planar, spaced-apart, radially extending, linearly elongated magnetron cathode/target assemblies each operating as a source of a sputtered target material for forming individual layers of a multilayer film on a substrate surface, and a means for serially passing a surface of a substrate over each of the cathode/target assemblies a requisite number of times for deposition of a multilayer film thereon, effectively addresses and solves problems attendant upon the use of sputtering techniques for the manufacture of, inter alia, high recording density, thin film magnetic and MO media, while maintaining full compatibility with all aspects of conventional automated manufacturing technology. Further, the means and methodology provided by the present invention enjoy diverse utility in the manufacture of other devices and products requiring multilayer thin film coatings.

DISCLOSURE OF THE INVENTION

An advantage of the present invention is an improved method for forming a multilayer thin film on at least one surface of a substrate.

Another advantage of the present invention is an improved method for forming a multilayer thin film with very good radial thickness uniformity over a disk-shaped substrate of wide diameter.

A further advantage of the present invention is an improved method for forming $(Co/Pd)_n$ and $(Co/Pt)_n$ multilayer superlattice structures by means of sputtering techniques.

A still further advantage of the present invention is an improved apparatus for forming multilayer thin films by sputtering.

Yet another advantage of the present invention is an improved apparatus for forming multilayer thin films on large diameter disk-shaped substrates with very good radial thickness uniformity of about +/−3%.

Additional advantages and other features of the present invention will be set forth in the description which follows and in part will become more apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of forming a multilayer film on at least one surface of a substrate with improved thickness uniformity, comprising the sequential steps of:

(a) providing a vacuum chamber comprising:
   (i) a pair of parallel top and bottom walls connected by at least one side wall;
   (ii) at least one entry/exit means in the at least one side wall for insertion and withdrawal of a substrate from the chamber;
   (iii) a plurality of spaced-apart, radially extending, linearly elongated sputtering sources arranged in a co-planar array adjacent one of the top or bottom walls of the chamber, each of the linearly elongated sputtering sources having a length and a width; and
   (iv) a gripper/transporter for gripping and moving the substrate in a generally circular, planar path past each of the plurality of radially extending sputtering sources, such that the at least one deposition surface of the substrate faces each of the sputtering sources during movement along the circular path, for deposition of multilayer film thereon;

(b) inserting the substrate into the chamber via the at least one side wall entry/exit means, the at least one deposition surface of the substrate having a maximum lateral dimension less than either the length or the width of each of the linearly elongated sputtering sources;

(c) gripping the substrate at edges thereof by means of the gripper/transporter;

(d) sputtering target material from each of the plurality of sputtering sources; and (e) moving the substrate by means of the gripper/transporter in a circular path past each of the plurality of sputtering sources and depositing on the at least one deposition surface thereof a desired multilayer film comprising a predetermined number of sub-layers.

According to an embodiment of the present invention, step (a)(i) comprises providing a generally cylindrically-shaped vacuum chamber comprising flat, circularly-shaped top and bottom walls connected by a curved side wall; step (a)(ii) comprises providing the at least one entry/exit means in the curved side wall; step (a)(iii) comprises providing at least a pair of radially extending, linearly elongated, magnetron sputtering sources adjacent the bottom wall of the chamber; and step (a)(iv) comprises providing the gripper/transporter as including a radially extending arm rotatable about an axis co-axial with that of the cylindrically-shaped chamber.

In accordance with an embodiment of the present invention, step (b) comprises inserting a disk-shaped substrate having a pair of opposed deposition surfaces, the diameter of the disk being less than the length and width of each of the sputtering sources; step (a)(iii) further comprises providing another plurality of spaced-apart, radially extending, linearly elongated sputtering sources arranged in a co-planar array adjacent the top wall of the cylindrically-shaped chamber for performing multilayer film deposition on each of the pair of deposition surfaces of the substrate.

Embodiments of the present invention comprise the further step of:

(f) removing the substrate from the chamber via the at least one entry/exit means after completion of step (e); wherein: step (a) comprises providing the vacuum chamber as part of an in-line, multi-station apparatus including at least one process module upstream of the vacuum chamber and at least one process module downstream of the vacuum chamber; step (b) comprises inserting the substrate into the vacuum chamber via a first entry/exit means which receives the substrate from an adjacent upstream process module; and step (f) comprises removing the substrate with the multilayer film thereon from the vacuum chamber via a second entry/exit means which supplies the substrate to an adjacent downstream process module.

In accordance with embodiments of the present invention, step (a)(iii) comprises providing a plurality of separately energizable sputtering sources; step (d) comprises regulating the energizing power applied to each sputtering source to provide a preselected rate of sputtering therefrom; and step (e) comprises regulating the moving speed of the substrate past the plurality of sputtering sources and selecting the number of times the substrate passes by the sputtering sources for deposition thereon of the desired multilayer film.

Embodiments of the present invention include providing in step (a)(iii) a plurality of linearly elongated, rectangularly-shaped sputtering sources each having a length of about 9 inches and a width of about 6 inches; and in step (b) a disk-shaped substrate is inserted which has a diameter of about 3.75 inches (95 mm).

According to a specific embodiment of the present invention, step (a)(iii) further comprises providing at least one pair of sputtering sources, a first one of the pair of sources being a Co source and a second one of the pair of sources being a Pd source or a Pt source; and step (e) comprises depositing on the at least one surface of the disk-shaped substrate a $(Co/Pd)_n$ or a $(Co/Pt)_n$ multilayer superlattice film, where n is an integer from about 10 to about 30, and the thickness of each of the Co and Pd or Pt sub-layers of the superlattice is from about 5 to about 8 Å, with a radial thickness uniformity of about +/−3% over the deposition surface of the 95 mm diameter disk.

According to another aspect of the present invention, an apparatus for forming a multilayer film on at least one surface of a substrate comprises a vacuum chamber including:

(a) a pair of parallel top and bottom walls connected by at least one side wall;

(b) at least one entry/exit means in the at least one side wall for insertion and withdrawal of a substrate from the chamber;

(c) a plurality of spaced-apart, radially extending, linearly elongated sputtering sources arranged in a co-planar array adjacent one of the top or bottom walls of the chamber, each of the linearly elongated sputtering sources having a length and a width; and (d) a gripper/transporter for gripping and moving the substrate in a generally circular, planar path past each of the plurality of radially extending sputtering sources, such that the at least one deposition surface of the substrate faces each of the sputtering sources during movement along the circular path, for deposition of the multilayer film thereon.

According to embodiments of the present invention, the vacuum chamber is generally cylindrically-shaped, including flat, circularly-shaped top and bottom walls connected by a curved side wall; the at least one entry/exit means is located in the curved side wall; the plurality of sputtering sources includes at least a pair of radially extending, linearly elongated, magnetron sputtering sources adjacent the bottom wall of the chamber; and the gripper/transporter comprises a radially extending arm rotatable about an axis co-axial with that of the cylindrically-shaped chamber.

In accordance with further embodiments of the present invention, the apparatus further comprises:

(e) a substrate conveyor means for inserting a disk-shaped substrate into the vacuum chamber via the entry/exit means, the disk having a pair of opposed deposition surfaces, the diameter of the disk being less than the length and the width of each of the sputtering sources; and (f) another plurality of spaced-apart, radially extending, linearly elongated sputtering sources arranged in a co-planar array adjacent the top wall of the cylindrically-shaped chamber for performing multi-layer film deposition on each of the pair of deposition surfaces of the disk-shaped substrate.

Embodiments of the present invention include apparatus wherein the vacuum chamber forms part of an in-line, multi-station apparatus including at least one process module upstream of the vacuum chamber and at least one process module downstream of the vacuum chamber; and the side wall of the vacuum chamber comprises a first entry/exit means which receives the substrate from an adjacent upstream process module for insertion into the vacuum chamber and a second entry/exit means opposite the first entry/exit means for withdrawing the substrate from the vacuum chamber and for supplying the substrate to an adjacent downstream process module.

According to embodiments of the present invention, the plurality of sputtering sources are separately energizable, whereby the energizing power applied to each sputtering source can be regulated to provide a preselected rate of sputtering therefrom; and the gripper/transporter includes means for regulating the speed of the substrate moving past the plurality of sputtering sources in the circular path and the number of times the substrate passes by the sputtering sources for deposition thereon of the desired multilayer film.

In accordance with particular embodiments of the present invention, each of the plurality of linearly elongated, rectangularly-shaped sputtering sources has a length of about 9 inches and a width of about 6 inches; and the substrate is a disk-shaped substrate having a diameter of about 3.75 inches (95 mm).

Embodiments of the present invention include apparatus wherein the plurality of sputtering sources comprises at least one pair of sputtering sources, a first one of the pair of sources being a Co source and a second one of the pair of sources being a Pd source or a Pt source; and the multilayer film formed on the at least one deposition surface of the substrate is a $(Co/Pd)_n$ or a $(Co/Pt)_n$ multilayer superlattice film, where n is an integer from about 10 to about 30, and the thickness of each of the Co and Pd or Pt sub-layers is from about 5 to about 8 Å, with a radial thickness uniformity of about +/–3% over the deposition surface of a 95 mm diameter disk as the substrate.

According to still another aspect of the present invention, an apparatus for forming a multilayer film on at least one surface of a substrate, comprises:

a vacuum chamber including therein a plurality of co-planar, linearly elongated, radially extending sputtering sources; and means for forming a sputter deposited multilayer film having a radial thickness uniformity of +/–3% on a surface of a disk-shaped substrate of 95 mm diameter.

Embodiments of the invention include apparatus which further comprise means for forming the multilayer film with the radial thickness uniformity of +/–3 % on the other surface of the disk-shaped substrate; and means for inserting and withdrawing the substrate from the vacuum chamber via a side wall of the chamber.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, which features are not necessarily drawn to scale but rather are shown as to best illustrate said features, wherein.

DESCRIPTION OF THE INVENTION

The present invention is based upon the recognition that a useful approach for forming sputtered multilayer film stacks and superlattice structures having a thickness uniformity suitable for use in the manufacture of magnetic and magneto-optical (MO) data/information recording, storage, and retrieval media, e.g., disk-type media, involves utilizing a pass-by sputter deposition process and apparatus wherein a disk-shaped substrate is moved in a circular path multiple times past a stationary plurality of confronting, linearly elongated, individually energizable sputtering sources in a single vacuum chamber for seriatim deposition thereon of the various sub-layers of the multilayer stack, each of the sputtering sources having substantially larger length and width dimensions than the disk diameter and extending in a radial direction to form a co-planar array. The vacuum chamber is equipped with at least one side-mounted substrate entry/withdrawal means and may be utilized as a stand-alone apparatus or as one module of a multi-station, in-line system for automated manufacture of recording media. The pass-by approach according to the present invention affords several advantages not attainable by the other approaches for multilayer sputter deposition discussed supra, including, inter alia, very good radial film thickness uniformity and reduction in system complexity due to placement of multiple sputtering sources in a single vacuum chamber or process module.

A key feature, i.e., advantage, of the multiple sputtering source pass-by approach according to the present invention is the flexibility of operation of the inventive apparatus and ease with which control of the multilayer sputter deposition process is accomplished, whereby a desired multilayer stack or superlattice structure is readily formed, at a desired manufacturing throughput, by appropriate regulation of: (1) the sputtering power applied to each of the sources for control of the rate of sputtering therefrom; (2) the speed at which the substrate moves past each of the sources; and (3) the number of times the substrate moves past the sources before withdrawal from the chamber.

Figure 1:
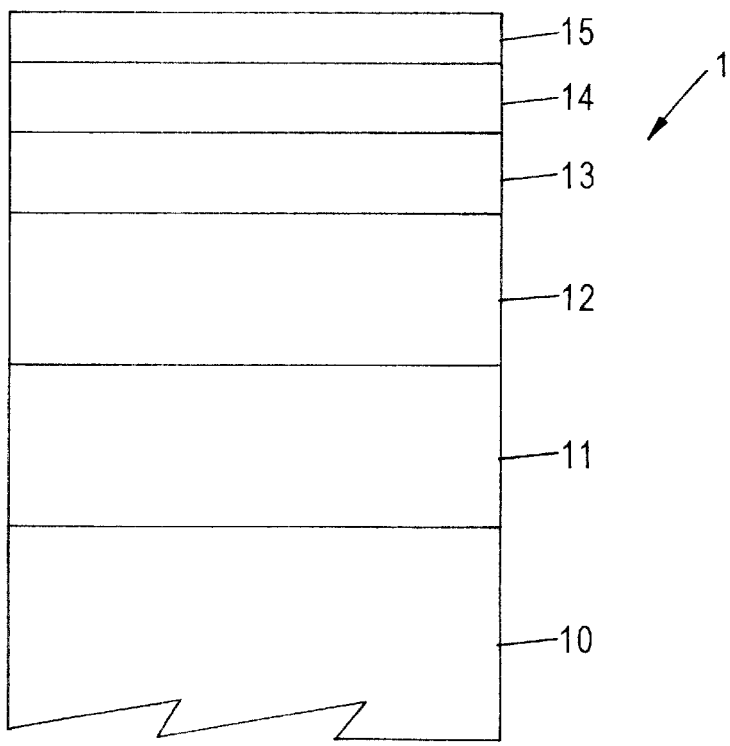
FIG. 1 schematically illustrates, in simplified cross-sectional view, a conventional magnetic data/information recording and retrieval medium.
Figure 2:
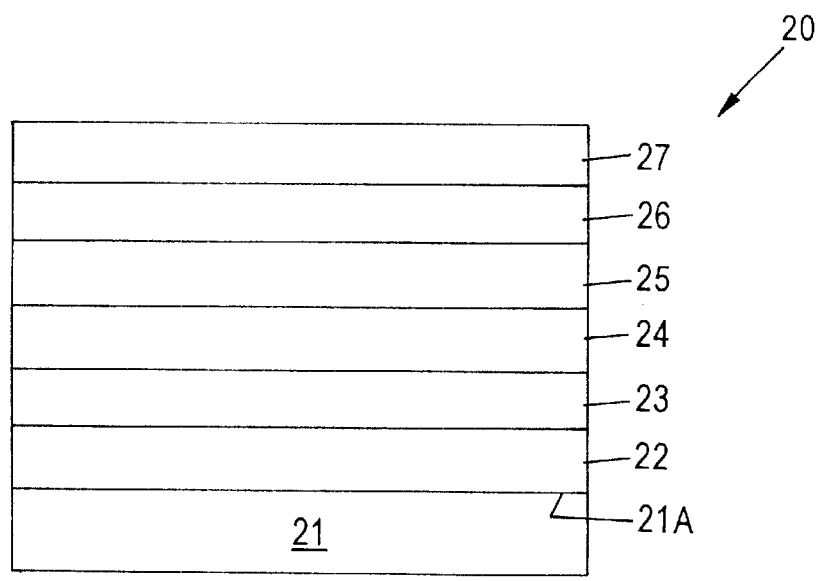
FIG. 2 schematically illustrates, in simplified cross-sectional view, a typical first surface magneto-optical (FSMO) data/information recording and retrieval medium.
Figure 3:
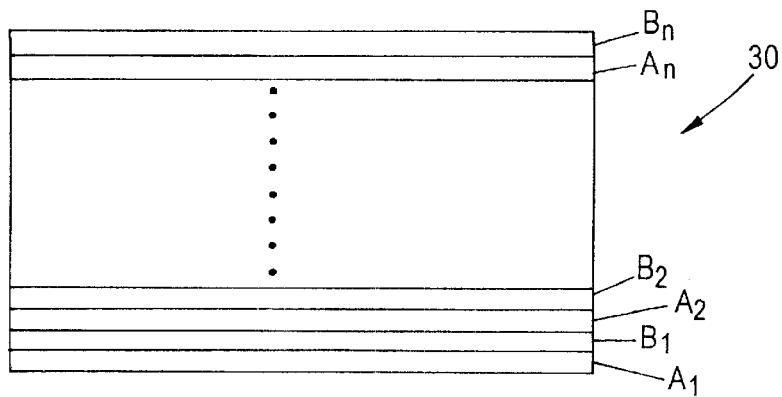
FIG. 3 schematically illustrates, in simplified cross-sectional view, a $(Co/Pt)_n$ or $(Co/Pd)_n$ superlattice structure suitable for use in the magnetic and magneto-optical (MO) media of FIGS. 1 and 2.
Figure 4:
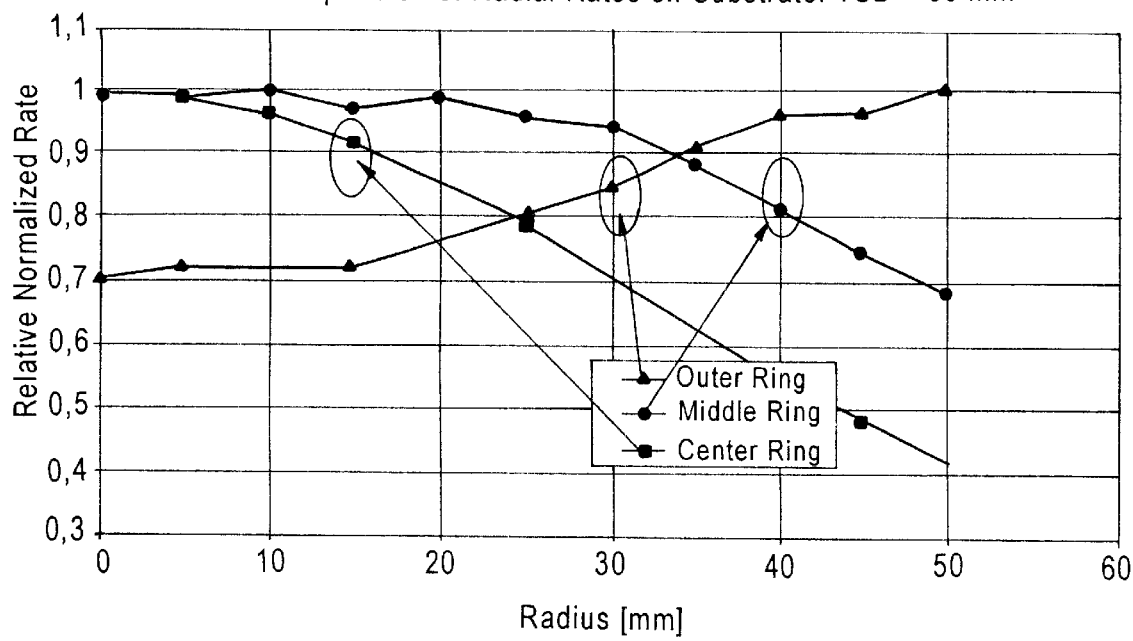
FIG. 4 is a graph for illustrating variation in radial deposition rates obtained with a Triatron™ three annular target ring sputtering source.
Figure 5:
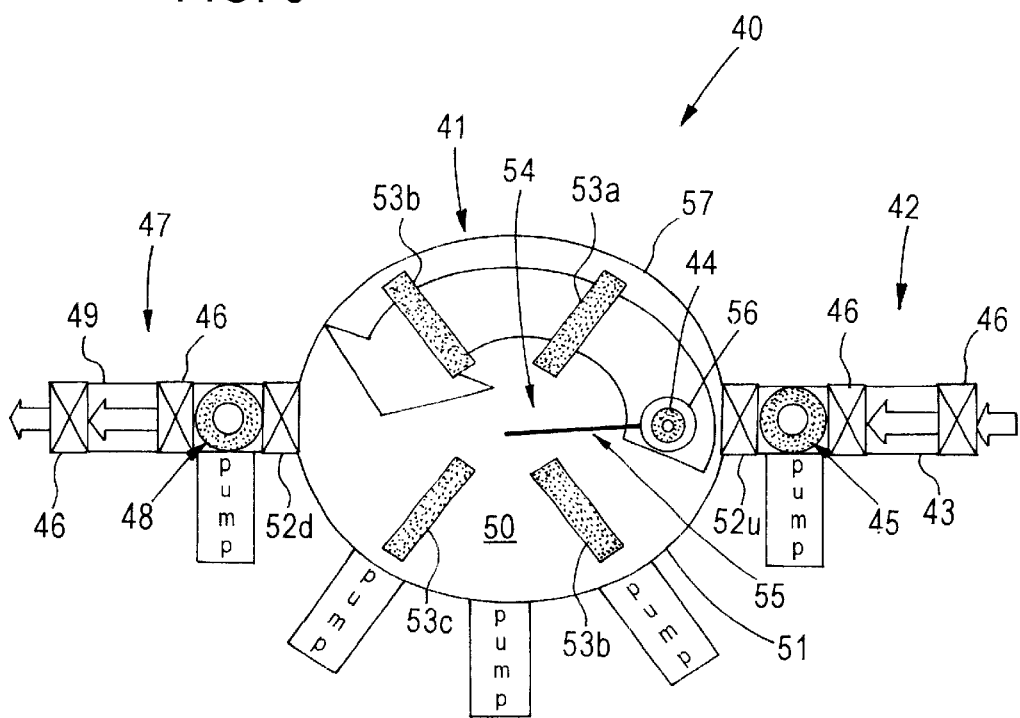
FIG. 5 schematically illustrates, in simplified sectional plan view, an embodiment of an in-line, side-loading multilayer sputtering apparatus/module according to the present invention.

Referring now to FIG. 5, shown therein in schematic, simplified plan view, is an embodiment of a side-loading pass-by apparatus 41 according to the present invention, adapted for forming multilayer thin film stacks or superlattice structures on annular disk-shaped substrates such as utilized in the manufacture of magnetic and MO recording media. It should be recognized that while apparatus 41 is shown in FIG. 5 as forming part (i.e., one module) of an in-line system 40 comprised of a plurality of modules each adapted for performing a specific function or process of a continuous, automated manufacturing line wherein substrates move in the direction of the arrow in the figure from right to left, use of apparatus 41 according to the invention is not limited to such in-line systems; rather, apparatus 41 is fully capable of use in stand-alone operation.

As illustrated, in-line system 40 comprises, from right-to-left in the figure, a portion 42 upstream of vacuum chamber 57 of apparatus 41 and including a load lock chamber 43 for introducing substrates 44 and a plurality of serially arranged upstream modules or stations for performing processing steps prior to multilayer deposition, such as for example, station 45 for performing static sputter deposition (note that only one upstream station is shown in the drawing for illustrative simplicity), interconnected by airlocks 46 or equivalently performing means; and a similarly constituted portion 47 downstream of vacuum chamber 57 of apparatus 41 and including a plurality of serially arranged downstream modules or stations, such as for example, station 48 for performing static sputter deposition, interconnected by means of air locks 46 or equivalently performing means, the downstream portion 47 terminating at exit lock chamber 49 for withdrawing substrates 44 from system 40.

Vacuum chamber 57 of apparatus 41 for performing multilayer sputter deposition on substrates 44 comprises a bottom wall 50, a top wall (not shown in the sectional plan view of the figure), and a side wall 51 connecting the top and bottom walls to form an enclosure. It should be recognized that while the circularly-shaped top and bottom walls and curved side wall are shown in the drawing as forming a generally cylindrically-shaped vacuum chamber 57, according to the invention, non-cylindrically-shaped chambers of dimensions sufficiently large as to accommodate the requisite radial array of rectangularly elongated sputtering sources may also be utilized. In any case, sidewall 51 of chamber 57 is provided at opposite sides thereof with substrate entry/exit means $52_U$ and $52_D$ respectively connected to upstream portion 42 and downstream portion 47 of system 40. It should also be recognized that the side wall 51 of chamber 57 may be provided with a single substrate entry/exit means, particularly when used in a stand-alone mode, in which case substrates 44 enter and exit the chamber at the same side thereof. Multilayer deposition chamber 57 of apparatus 41 and each of the upstream and downstream processing stations 45 and 48, respectively, are provided with at least one vacuum pump means for maintaining each chamber under vacuum conditions.

As illustrated, a first plurality of spaced-apart, linearly elongated, radially extending sputtering sources, for example sources $53_a$–$53_d$ are arranged in a co-planar array adjacent the bottom wall 50 of chamber 57 for directing sputtered particle fluxes emanating therefrom toward the opposite (i.e., top) wall of the chamber for deposition on a first (i.e., lower) surface of a substrate 44. A second plurality of spaced-apart, linearly elongated, radially extending sputtering sources $53_a$–$53_d$ may, if desired, be arranged in a co-planar array adjacent the top wall of chamber 57 for directing sputtered particle fluxes emanating therefrom toward the chamber bottom wall 50 for deposition on a second (i.e., upper) surface of substrate 44.

It should be recognized that, according to the invention, the number of sputtering sources is not limited to the four (4) shown in the figure, but may be as little as two (2) or greater than four. Further, whereas sources $53_a$–$53_d$ are shown in the figure as rectangularly-shaped, other elongated shape sources may be utilized, such as, for example, elongated oval-shaped (i.e., "racetrack") sources, provided the length and width dimensions thereof are greater than the largest lateral dimension of the substrate 44. Planar magnetron sources are preferred for use according to the present invention in view of the high sputtering rates obtainable therefrom. Each of the sources $53_a$–$53_d$ or each pair of radially opposed sources, e.g., $53_a$–$53_c$ and $53_b$–$53_d$, is provided with a regulable means for DC or RF energization.

Chamber 57 is further provided with a substrate gripper/transporter 54 for gripping a substrate 44 at the peripheral edge thereof and for moving the substrate in a circular path (as indicated by the arrow in the figure) past the at least one radially arranged array of sputtering sources $53_a$–$53_d$. A suitable gripper/transporter 54 for use according to the invention comprises a radially extending arm 55 rotatably mounted at its inner end for rotation about the central axis of the cylindrical chamber 57 and including a gripping means of known type at its outer end for gripping a substrate 44 at the peripheral edge(s) thereof, e.g., around the outer circumference of an annular disc-shaped substrate 44 such as utilized in the manufacture of magnetic and MO recording media.

In operation of system 40, substrates 44, e.g., annular disk-shaped substrates, enter the system at the upstream portion 42 thereof via load lock chamber 43 and are transported, via intervening air lock chambers 46 to and through one or more in-line process stations 45 for processing therein (e.g., plasma cleaning, deposition of seed layers, etc.) antecedent to multilayer sputter deposition in chamber 57. One substrate 44 enters chamber 57 at a time, via entry/exit means $52_U$, and is gripped at the peripheral edge(s) thereof by means of gripper portion 56 of gripper/transporter 54 and moved in a circular path in the space above the first plurality of sputtering sources $53_a$–$53_d$ for multilayer deposition on a first, i.e., lower, surface thereof; or alternatively, in the space between the first and second pluralities of sputtering sources $53_a$–$53_d$ for multilayer deposition on first and second, i.e., lower and upper, surfaces thereof.

The inventive apparatus is extremely versatile in that a large variety of multilayer structures may be formed by suitable selection of the number and type of sputtering sources, i.e., the number of targets as well as the particular target materials of the various sputtering sources are selected on the basis of the multilayer structure desired to be formed. For example, each of the sputtering sources may comprise a different target material, or a pair of sources, e.g., radially opposed sources, may be comprised of the same target material. Thus, for a four (4) source arrangement as illustrated in FIG. 5, each of sources $53_a$–$53_d$ may comprise a different target material or first and second radially opposed source pairs $53_a$–$53_c$ and $53_b$–$53_d$, respectively, may comprise first and second target materials, respectively. Baffle means (not shown in the drawing for illustrative simplicity) may be placed between adjacent sources when the latter are of different target materials, in order to prevent, or at least reduce, cross-contamination of sputtered particle fluxes. The sputtering rate of each source (or each radially opposed pair of sources), revolution speed of substrate gripper/transporter 54, and number of revolution cycles of the substrate gripper/transporter past the at least one array of sputtering sources $53_a$–$53_d$ are controllable/regulatable, as by computer or other automatic control means (also not shown in the figure for illustrative simplicity), for providing a desired multilayer structure (including type and number of sub-layers, as well as number of sub-layer periods) and throughput requirement. The inventive apparatus is capable of providing multilayer sputtered films on 95 mm disk-shaped substrates with a radial thickness uniformity of about +/−3%.

EXAMPLE

An apparatus such as described above is to be utilized for the formation of $(CO/Pt)_n$ superlattices on one surface annular disk-shaped substrates, wherein the target materials of adjacent rectangularly-shaped magnetron sputtering sources alternate between Co and Pt to form pairs of radially opposed Co and Pt sources. The following parameters are taken into consideration for obtaining such superlattices at an economically viable throughput and with good radial thickness uniformity:

| | |
|---|---|
| Throughput, disks/hr. ("dph") | 500 |
| Total process time/disk | 7.2 sec. |
| Load + unload time | 0.75 sec. |
| Pumpout + gas stabilization time | 0.75 sec. |
| Sputtering process duration | 5.7 sec. |
| Number n of superlattice layer pairs | 30 |
| Number of sputtering sources | 8 |
| Pairs of sputtering sources | 4 |
| Width of sputtering sources | 6 in. |
| Length of sputtering source | 9 in. |
| Distance-chamber center to source center | 15 in. |
| Circumference of circle for this distance | 94 in. |
| Layer pairs for 1 revolution of transport arm | 4 |
| Arm speed/process duration | 1.3 rev./sec. (= 79 rpm) |
| Time for 1 revolution | 0.76 sec. |
| Time of disk over each source | 0.05 sec. |
| Co deposition rate | 130 Å/sec. |
| Co layer thickness | 6 Å |
| Pt deposition rate | 180 Å/sec. |
| Pt layer thickness | 9 Å |
| Radial thickness uniformity | +/- 3% |

Thus, the present invention advantageously provides a method and apparatus for forming multilayer thin film stacks and superlattice structures by means of a single chamber, side-loading, multi sputtering source apparatus operating in a single disk, pass-by deposition mode. The single chamber apparatus is capable of stand-alone use (e.g., as for research/development/testing) or when utilized as part of an economically competitive, continuous, automated, multi-station, in-line apparatus such as is employed for the manufacture of disk-shaped magnetic and/or MO recording media. Further, the inventive methodology and apparatus are not limited to forming the specifically disclosed magnetic and/or MO recording media. Rather, the invention is broadly applicable to the manufacture of various types of products requiring multilayer films or coatings, e.g., optical coatings such as interference filters and wavelength-specific reflectors.

In the previous description, numerous specific details are set forth, such as specific materials, structures, processes, etc., in order to provide a better understanding of the present invention. However, the present invention can be practiced without resorting to the details specifically set forth. In other instances, well-known processing techniques and/or instrumentalities have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of forming a multilayer film on at least one surface of a substrate with improved thickness uniformity, comprising the sequential steps of:
   (a) providing a vacuum chamber comprising:
      (i) a pair of parallel top and bottom walls connected by at least one side wall;
      (ii) at least one entry/exit means in said at least one side wall for insertion and withdrawal of a substrate from said chamber;
      (iii) a plurality of spaced-apart, radially extending, linearly elongated sputtering sources arranged in a co-planar array adjacent one of said top or bottom walls of said chamber, each of said linearly elongated sputtering sources having a length and a width; and
      (iv) a gripper/transporter for gripping and moving a said substrate in a generally circular, planar path past each of said plurality of radially extending sputtering sources, such that said at least one deposition surface of said substrate faces each of said sputtering sources during movement along said circular path, for deposition of multilayer film thereon;
   (b) inserting a said substrate into said chamber via said at least one side wall entry/exit means, the at least one deposition surface of said substrate having a maximum lateral dimension less than either said length or said width of each of said linearly elongated sputtering sources;
   (c) gripping said substrate at edges thereof by means of said gripper/transporter;
   (d) sputtering target material from each of said plurality of sputtering sources; and
   (e) moving said substrate by means of said gripper/transporter in a circular path past each of said plurality of sputtering sources and depositing on said at least one deposition surface thereof a desired multilayer film comprising a predetermined number of sub-layers.

2. The method according to claim 1, wherein:
   step (a)(i) comprises providing a generally cylindrically-shaped vacuum chamber comprising flat, circularly-shaped top and bottom walls connected by a curved side wall;
   step (a)(ii) comprises providing said at least one entry/exit means in said curved side wall;
   step (a)(iii) comprises providing at least a pair of radially extending, linearly elongated, magnetron sputtering sources adjacent said bottom wall of said chamber; and
   step (a)(iv) comprises providing said gripper/transporter as including a radially extending arm rotatable about an axis co-axial with that of said cylindrically-shaped chamber.

3. The method according to claim 2, wherein:
   step (b) comprises inserting a disk-shaped substrate having a pair of opposed deposition surfaces, the diameter of said disk being less than said length and width of each of said sputtering sources.

4. The method according to claim 3, wherein:
   step (a)(iii) further comprises providing another plurality of spaced-apart, radially extending, linearly elongated sputtering sources arranged in a co-planar array adjacent said top wall of said cylindrically-shaped chamber for performing multilayer film deposition on each of said pair of deposition surfaces of said substrate.

5. The method according to claim 1, further comprising the step of:
   (f) removing said substrate from said chamber via said at least one entry/exit means after completion of step (e).

6. The method according to claim 5, wherein:
   step (a) comprises providing said vacuum chamber as part of an in-line, multi-station apparatus including at least one process module upstream of said vacuum chamber and at least one process module downstream of said vacuum chamber;
   step (b) comprises inserting said substrate into said vacuum chamber via a first entry/exit means which receives said substrate from an adjacent upstream process module; and
   step (f) comprises removing said substrate with said multilayer film thereon from said vacuum chamber via a second entry/exit means which supplies said substrate to an adjacent downstream process module.

7. The method according to claim 1, wherein:
   step (a)(iii) comprises providing a plurality of separately energizable sputtering sources;

step (d) comprises regulating the energizing power applied to each sputtering source to provide a preselected rate of sputtering therefrom; and step (e) comprises regulating the moving speed of said substrate past said plurality of sputtering sources and selecting the number of times said substrate passes by said sputtering sources for deposition thereon of said desired multilayer film.

8. The method according to claim 7, wherein:

step (a)(iii) comprises providing a plurality of linearly elongated, rectangularly-shaped sputtering sources each having a length of about 9 inches and a width of about 6 inches; and step (b) comprises inserting a disk-shaped substrate having a diameter of about 3.75 inches (95 mm).

9. The method according to claim 8, wherein:

step (a)(iii) further comprises providing at least one pair of sputtering sources, a first one of said pair of sources being a Co source and a second one of said pair of sources being a Pd source or a Pt source; and step (e) comprises depositing on said at least one deposition surface of said disk-shaped substrate a $(Co/Pd)_n$ or a $(Co/Pt)_n$ multilayer superlattice film, where n is an integer from about 10 to about 30, and the thickness of each of the Co and Pd or Pt sub-layers of said superlattice is from about 5 to about 8 Å, with a radial thickness uniformity of about +/−3% over the deposition surface of said 95 mm diameter disk.

10. An apparatus for forming a multilayer film on at least one surface of a substrate, comprising a vacuum chamber including:

(a) a pair of parallel top and bottom walls connected by at least one side wall;

(b) at least one entry/exit means in said at least one side wall for insertion and withdrawal of a substrate from said chamber;

(c) a plurality of spaced-apart, radially extending, linearly elongated sputtering sources arranged in a co-planar array adjacent one of said top or bottom walls of said chamber, each of said linearly elongated sputtering sources having a length and a width; and (d) a gripper/transporter for gripping and moving a said substrate in a generally circular, planar path past each of said plurality of radially extending sputtering sources, such that said at least one deposition surface of said substrate faces each of said sputtering sources during movement along said circular path, for deposition of said multilayer film thereon.

11. The apparatus as in claim 10, wherein:

said vacuum chamber is generally cylindrically-shaped, including flat, circularly-shaped top and bottom walls connected by a curved side wall;

said at least one entry/exit means is located in said curved side wall;

said plurality of sputtering sources includes at least a pair of radially extending, linearly elongated, magnetron sputtering sources adjacent said bottom wall of said chamber; and said gripper/transporter comprises a radially extending arm rotatable about an axis co-axial with that of said cylindrically-shaped chamber.

12. The apparatus as in claim 11, further comprising:

(e) a substrate conveyor means for inserting a disk-shaped substrate into said vacuum chamber via said entry/exit means, said disk having a pair of opposed deposition surfaces, the diameter of said disk being less than said length and said width of each of said sputtering sources.

13. The apparatus as in claim 12, further comprising:

(f) another plurality of spaced-apart, radially extending, linearly elongated sputtering sources arranged in a co-planar array adjacent said top wall of said cylindrically-shaped chamber for performing multilayer film deposition on each of said pair of deposition surfaces of said disk-shaped substrate.

14. The apparatus as in claim 10, wherein:

said vacuum chamber forms part of an in-line, multi-station apparatus including at least one process module upstream of said vacuum chamber and at least one process module downstream of said vacuum chamber; and said side wall of said vacuum chamber comprises a first entry/exit means which receives said substrate from an adjacent upstream process module for insertion into said vacuum chamber and a second entry/exit means opposite said first entry/exit means for withdrawing said substrate from said vacuum chamber and for supplying said substrate to an adjacent downstream process module.

15. The apparatus as in claim 10, wherein:

said plurality of sputtering sources are separately energizable, whereby the energizing power applied to each sputtering source can be regulated to provide a preselected rate of sputtering therefrom; and said gripper/transporter includes means for regulating the speed of said substrate moving past said plurality of sputtering sources in said circular path and the number of times said substrate passes by said sputtering sources for deposition thereon of said desired multilayer film.

16. The apparatus as in claim 15, wherein:

each of said plurality of linearly elongated, rectangularly-shaped sputtering sources has a length of about 9 inches and a width of about 6 inches; and said substrate is a disk-shaped substrate having a diameter of about 3.75 inches (95 mm).

17. The apparatus as in claim 16, wherein:

said plurality of sputtering sources comprises at least one pair of sputtering sources, a first one of said pair of sources being a Co source and a second one of said pair of sources being a Pd source or a Pt source; and said multilayer film formed on said at least one deposition surface of said substrate is a $(Co/Pd)_n$ or a $(Co/Pt)_n$ multilayer superlattice film, where n is an integer from about 10 to about 30, and the thickness of each of the Co and Pd or Pt sub-layers is from about 5 to about 8 Å, with a radial thickness uniformity of about +/−3% over the deposition surface of a 95 mm diameter disk as said substrate.

18. An apparatus for forming a multilayer film on at least one surface of a substrate, comprising:

a vacuum chamber including therein a plurality of co-planar, linearly elongated, radially arranged sputtering sources; and means for forming a sputter deposited multilayer film having a radial thickness uniformity of +/−3% on a first surface of a disk-shaped substrate of 95 mm diameter.

19. The apparatus as in claim 18, further comprising:

means for forming a sputter deposited multilayer film with radial thickness uniformity of +/−3% on a second, oppositely facing surface of said disk-shaped substrate.

20. The apparatus as in claim 18, further comprising:

means for inserting and withdrawing a said substrate from said vacuum chamber via a side wall of said chamber.

* * * * *